United States Patent
Kutzer et al.

(10) Patent No.: US 9,177,860 B2
(45) Date of Patent: Nov. 3, 2015

(54) METHOD FOR PROCESSING AT LEAST ONE CRYSTALLINE SILICON-WAFER WITH A THERMAL BUDGET OR A SOLAR-CELL WAFER WITH A THERMAL BUDGET BY A LASER BEAM

(71) Applicant: SolarWorld Innovations GmbH, Freiberg (DE)

(72) Inventors: Martin Kutzer, Penig (DE); Joachim Koenig, Haenichen (DE); Matthias Richter, Coswig (DE)

(73) Assignee: SOLARWORLD INNOVATIONS GMBH, Freiberg (DE)

( * ) Notice: Subject to any disclaimer, the term of this patent is extended or adjusted under 35 U.S.C. 154(b) by 0 days.

(21) Appl. No.: 14/094,863

(22) Filed: Dec. 3, 2013

(65) Prior Publication Data

US 2014/0154831 A1 Jun. 5, 2014

(30) Foreign Application Priority Data

Dec. 3, 2012 (DE) .......................... 10 2012 111 698

(51) Int. Cl.
| | | |
|---|---|---|
| *H01L 21/00* | (2006.01) | |
| *H01L 21/78* | (2006.01) | |
| *B23K 26/36* | (2014.01) | |
| *H01L 31/18* | (2006.01) | |
| *H01L 21/3065* | (2006.01) | |

(52) U.S. Cl.
CPC .............. *H01L 21/78* (2013.01); *B23K 26/367* (2013.01); *H01L 21/3065* (2013.01); *H01L 31/18* (2013.01); *H01L 31/1804* (2013.01); *Y02E 10/547* (2013.01)

(58) Field of Classification Search
CPC ........ B23K 26/10; B23K 15/00; H01L 21/78; H01L 31/18
USPC ................... 438/68, 463; 219/121.61, 121.68
See application file for complete search history.

(56) References Cited

U.S. PATENT DOCUMENTS

| | | | |
|---|---|---|---|
| 3,629,545 A | | 12/1971 | Graham et al. |
| 4,372,989 A | * | 2/1983 | Menzel .......................... 427/555 |
| 4,415,794 A | * | 11/1983 | Delfino et al. ........... 219/121.85 |
| 5,609,284 A | | 3/1997 | Kondratenko |
| 6,531,681 B1 | * | 3/2003 | Markle et al. ............... 219/121.8 |
| 6,844,523 B2 | * | 1/2005 | Yamazaki et al. ........ 219/121.66 |
| 6,987,240 B2 | * | 1/2006 | Jennings et al. ........... 219/121.8 |
| 7,052,978 B2 | * | 5/2006 | Shaheen et al. ............... 438/463 |
| 7,154,066 B2 | * | 12/2006 | Talwar et al. ............... 219/121.8 |
| 7,279,657 B2 | * | 10/2007 | Hegedus .................. 219/121.73 |
| 8,148,663 B2 | * | 4/2012 | Adams et al. ............ 219/121.75 |
| 8,319,149 B2 | * | 11/2012 | Ma et al. ..................... 219/121.8 |
| 2004/0198028 A1 | * | 10/2004 | Tanaka et al. ................. 438/487 |
| 2005/0269298 A1 | * | 12/2005 | Hotta et al. ................ 219/121.8 |
| 2007/0138151 A1 | * | 6/2007 | Tanaka et al. ............ 219/121.65 |

(Continued)

*Primary Examiner* — Caleb Henry

(57) ABSTRACT

In different embodiments, a method is provided for processing at least one crystalline Silicon-wafer or a Solar-cell wafer. The method may include: a movement of the wafer with respect to a laser producing a laser beam; and therefore the formation of a laser channel in the wafer by means of a laser beam, wherein a thermal budget applied on the wafer by means of the laser beam is reduced in the peripheral region of the wafer, wherein the peripheral region includes a wafer edge, through which the laser beam exits the wafer after formation of the laser channel.

20 Claims, 5 Drawing Sheets

(56) References Cited

U.S. PATENT DOCUMENTS

| | | | |
|---|---|---|---|
| 2008/0121626 A1* | 5/2008 | Thomas et al. | 219/121.62 |
| 2008/0173620 A1* | 7/2008 | Grek et al. | 219/121.8 |
| 2009/0261078 A1* | 10/2009 | Ma et al. | 219/121.8 |
| 2011/0146771 A1* | 6/2011 | Chuang et al. | 136/255 |
| 2013/0320478 A1* | 12/2013 | JangJian et al. | 257/460 |
| 2014/0127852 A1* | 5/2014 | de Souza et al. | 438/97 |

* cited by examiner

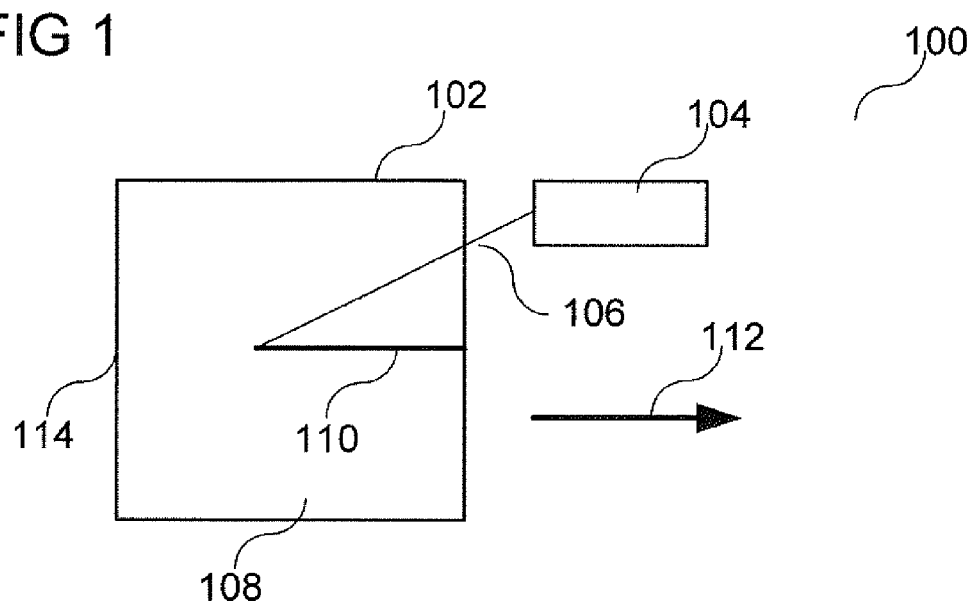
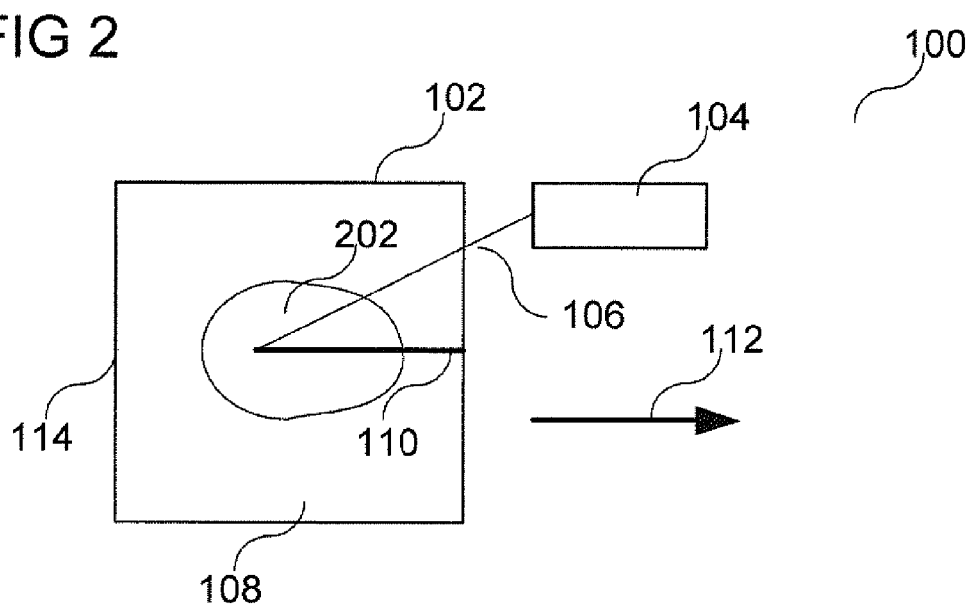

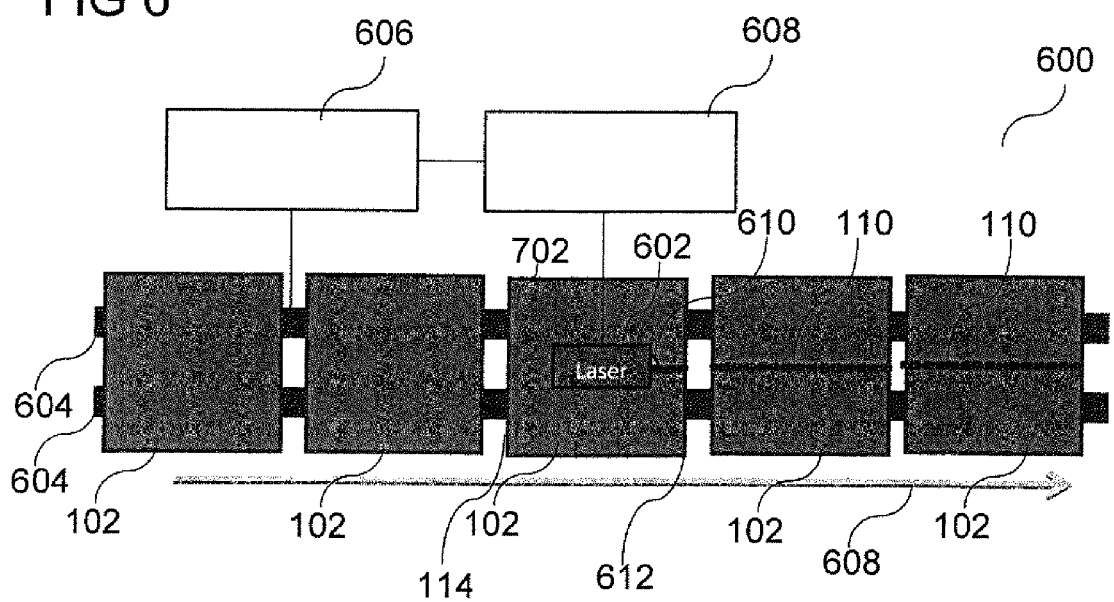

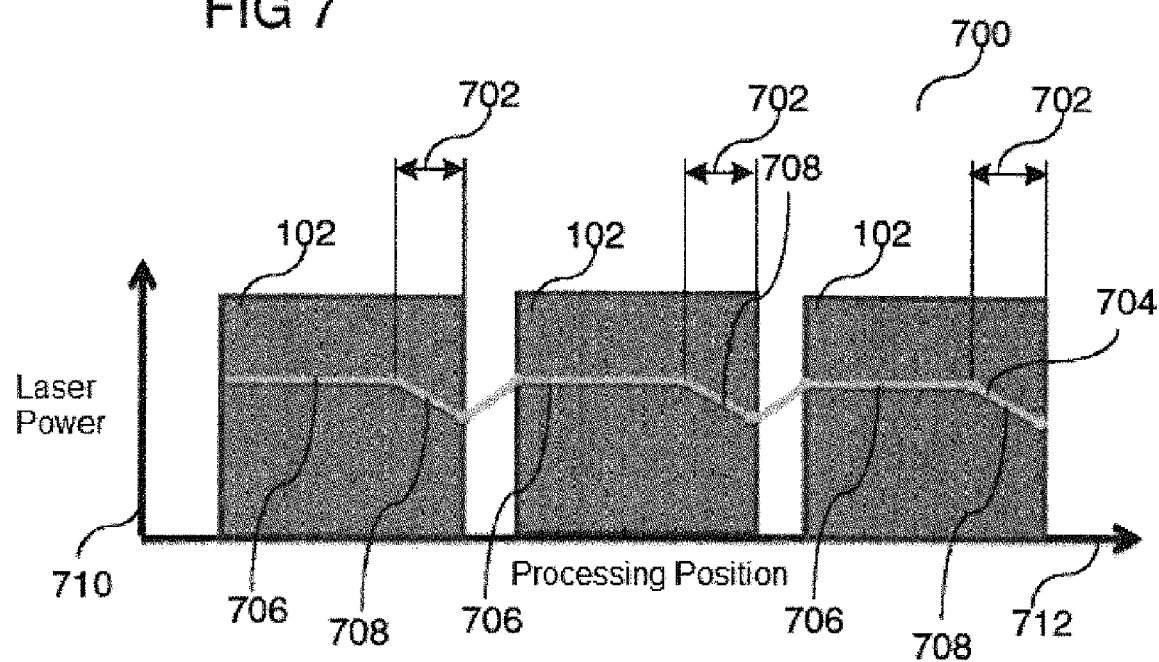

METHOD FOR PROCESSING AT LEAST ONE CRYSTALLINE SILICON-WAFER WITH A THERMAL BUDGET OR A SOLAR-CELL WAFER WITH A THERMAL BUDGET BY A LASER BEAM

RELATED APPLICATIONS

This application claims priority to German Patent Application Serial No. 10 2012 111 698.9, which was filed Dec. 3, 2012, and is incorporated herein by reference in its entirety.

TECHNICAL FIELD

Various embodiments relate to a method and a device for processing at least one crystalline Silicon wafer or a solar-cell wafer.

SUMMARY

The division of solar-cells offers an advantage by an improvement in efficiency while using half solar cells in a photovoltaic module; furthermore solar cells with errors on one side (edge breakage, misprint, local shunt) can be cut into smaller solar cells and in this manner, can still be used.

Generally, laser processes are used for the division of solar cell wafers, because these are particularly gentle. Generally, the solar cell wafers are scratched by means of a laser and subsequently broken. In this manner, reliable break-lines are obtained. The insulation of the break-lines is achieved, in which the laser processing takes place outside of the p-n junction of the solar cell or the solar cell wafer.

Laser system with relatively lower laser-power can be used for the processing of the solar cell wafer, wherein the required ablation depth ($\frac{1}{3}^{rd}$ of the wafer thickness) is then generally takes place by several crossings of the laser channel by means of the laser. Nevertheless, complex laser optics is necessary, which increases the overall costs of the system and the processing costs as well. In this case, it is necessary to use complex for the laser (whereby the costs for the laser components are increased) and/or to carry out multiple processing of the solar cell wafer by lower laser-power. Even in such a case of the multiple processing of the solar cell wafer, the cycle time is considerably increased in the framework of the division of the solar cells.

Generally, a laser with a higher laser-power (about 20 W) is used, so that the required ablation depth is realized in a processing step. Therefore, a static laser can be used and a relative movement between the solar cell and laser is obtained.

FIG. 1 shows a conventional device 100 for processing at least one wafer 102. A laser 104 is provided in the device 100. The wafer 102 is moved with respect to the laser 104 (generally a static laser 104), so that a laser beam 106 is guided along above the wafer surfaces 108 (the movement of the wafer 102 with respect to the laser beam 106 is symbolized by means of a first arrow 112), so that a laser channel 110 is formed. After formation of the laser channel 110, the wafer 102 is generally broken along the laser channel 110.

Therefore, the heat which the laser 104 enters into the wafer 102 by means of the laser beam 106 is partially dissipated by the wafer (represented in FIG. 2 by means of a first heat propagation zone 202, which is located in a central region of the wafer 102). When the processing point draws near the output side of the wafer edge 114, it leads to a heat accumulation in a peripheral region of the wafer 102, the heat does not dissipate adequately anymore. The processing location is subjected to increased preheating and the laser ablation is increased (represented in FIG. 3 by means of a second heat propagation zone 302, which is located in a peripheral region of the wafer 102).

Therefore, the depth of the formed laser channel 110 is increased in the peripheral region of the wafer 102. This can lead to that the p-n junction of the solar cell is processed. As a result, the wafer edge 114 is short-circuited. On the other hand, by the variation of the laser channel, it can lead to an imprecise breakage or break-out within the framework of the subsequent breakage of the wafer 102.

FIG. 4 shows a picture 400 of a scratched solar cell wafer, in other words, a wafer 102, in which it corresponds to a complete cut 402 at the wafer end, that is, at the wafer edge 114.

In different exemplary embodiments, the risk of an undesired damage to the wafer (for instance of a crystalline Silicon wafer or a Solar cell wafer) is significantly reduced, for instance altogether avoided within the framework of a laser-scratching process on an end side wafer edge.

In different exemplary embodiments, a method is provided for processing at least one crystalline Silicon-wafer or a Solar-cell wafer. The method can include: moving the wafer with respect to a laser producing a laser beam; and therefore forming a laser channel in the wafer by means of a laser beam, wherein a thermal budget applied on the wafer by means of the laser beam is reduced in the peripheral region of the wafer, wherein the peripheral region has a wafer edge, through which the laser beam exits the wafer, after formation of the laser channel.

Thus in different exemplary embodiments, the damage to the p-n junction of a solar cell wafer can be reduced or altogether avoided. Generally, the damage to the wafer may be reduced or altogether avoided, wherein particularly an end side cut is avoided at the wafer edge.

In a configuration, the wafer can be moved with respect to a static laser generating the laser beam.

In still another configuration, the wafer can be moved with respect to the laser outside of the peripheral region with a first speed; and the wafer can be moved with respect to the laser in the peripheral region with at least a second speed which is higher than the first speed.

Alternatively or additionally, the wafer can be applied, for instance outside of the peripheral region, with a first laser beam of a first laser-power; and the wafer can be applied, in the peripheral region, with a laser beam of a second laser-power which is lower than the first laser-power.

In yet another configuration, the wafer can be applied with a laser beam, outside the peripheral region; the focussing of the laser beam is in the plane of the wafer. Furthermore, the wafer may be applied with a laser beam within the peripheral region; the focussing of the laser beam is outside of the wafer plane.

In still another configuration, the method can further include: dividing the wafer along the formed laser channels.

In yet another configuration, the wafer can be broken along the formed laser channels.

In still another configuration, several wafers can be moved with respect to the laser; and a laser channel can be formed in each wafer by means of the laser beam, wherein the thermal budget applied on the wafer by means of the laser beam is reduced in the respective peripheral region of the respective wafer.

In yet another configuration, the laser beam can be generated with a laser-power in a range of approximately 10 Watt to approximately 30 Watt.

In still another configuration, the peripheral region can be formed by a surface area of the wafer, which extends from the wafer edge up to maximum 5 cm into the wafer, for instance maximum up to 3 cm, for instance maximum up to 2 cm, for instance maximum up to 1 cm, for instance maximum up to 0.5 cm, for instance maximum up to 0.2 cm, for instance maximum up to 0.1 cm.

In different exemplary embodiments, a device is provided for processing at least one crystalline Silicon wafer or a Solar-cell wafer, wherein the device includes: a laser arranged for generating a laser beam; a device for moving the wafer with respect to the laser; and a control device arranged to control the laser, and/or the device for moving the wafer in such a manner that a laser channel is formed in the wafer by means of the laser beam, wherein the thermal budget applied on the wafer by means of the laser beam, is reduced in the peripheral region of the wafer, wherein the peripheral region has a wafer edge, through which the laser beam exits the wafer after formation of the laser channel.

In one configuration, the laser can be a static laser, in other words, a laser which is mounted immovably at a predefined position, so that it does not move over the wafer, but the wafer is moved with respect to an unmoved laser.

In one configuration, the control device can be arranged for moving the wafer with respect to the laser outside of the peripheral region with a first speed; and for moving the wafer with respect to the laser in the peripheral region with at least a second speed, which is higher than the first speed.

In yet another configuration, the control device is arranged to apply the wafer, outside of the peripheral region, with a first laser beam of a first laser-power; and to apply the wafer, in the peripheral region, with a laser beam of a second laser-power, which second laser-power is smaller than the first laser-power.

In still another configuration, the second laser-power is in the range of approximately 10% up to approximately 80% below the first laser-power.

In yet another configuration, the second laser-power can decrease constantly or in steps and can be in a range of approximately 10% up to approximately 80% below the first laser-power at the wafer edge.

In still another configuration, the device can further include a dividing device for dividing the wafer along the laser channel formed.

In another configuration, the device dividing device can be arranged for breaking the wafer along the laser channel formed.

In yet another configuration, the device for moving the wafer is arranged for moving several wafers with respect to the laser and can include a conveyor belt for accommodating several wafers.

In still another configuration, the laser can be arranged for generating the laser beam with the laser-power in a range of approximately 10 Watt up to approximately 30 Watt.

In yet another configuration, the laser can be supplied or arranged in such a manner that the focus position of the laser can be changed.

In still another configuration, the focus of the laser beam can be outside of the peripheral region in the area of the solar cell wafer, particularly within the solar cell wafer. The focus position of the laser is adjusted within the peripheral region in such a manner that the focus is outside of the wafer. The laser can be clearly defocused in the peripheral region. As a result, the depth of cut can similarly be maintained constant.

In yet another configuration, the peripheral region can be formed by a surface area of the wafer, which extends from the wafer edge maximum up to 5 cm in the wafer, for instance maximum up to 3 cm, for instance maximum up to 2 cm, for instance maximum up to 1 cm, for instance maximum up to 0.5 cm, for instance maximum up to 0.2 cm, for instance maximum up to 0.1 cm.

BRIEF DESCRIPTION OF THE DRAWINGS

In the drawings, like reference characters generally refer to the same parts throughout the different views. The drawings are not necessarily to scale, emphasis instead generally being replaced upon illustrating the principles of the disclosure. In the following description, various embodiments of the disclosure are described with reference to the following drawings, in which:

FIG. 1 shows a conventional device for processing at least one wafer;

FIG. 2 shows a device for processing at least one wafer of FIG. 1 with a heat propagation zone in the wafer;

FIG. 6 shows a device for processing at least one crystalline silicon wafer or a solar cell wafer according to different exemplary embodiments; and FIG. 7 shows a diagram, in which a modified laser-power according to different exemplary embodiments is represented in a peripheral region of the wafer.

DETAILED DESCRIPTION

Figure 3:
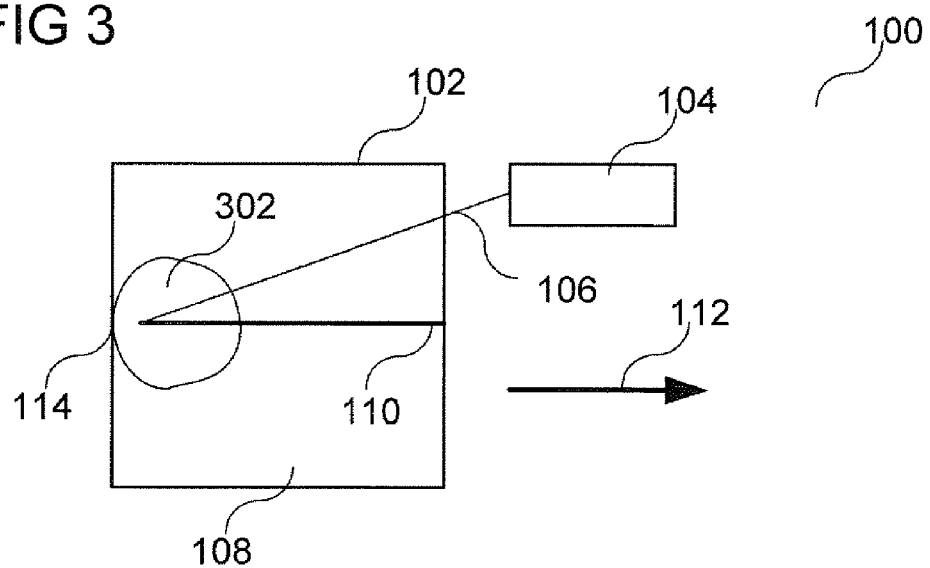
FIG. 3 shows a device for processing at least one wafer of FIG. 1 with a heat propagation zone in the wafer in a peripheral region of the wafer.
Figure 4:
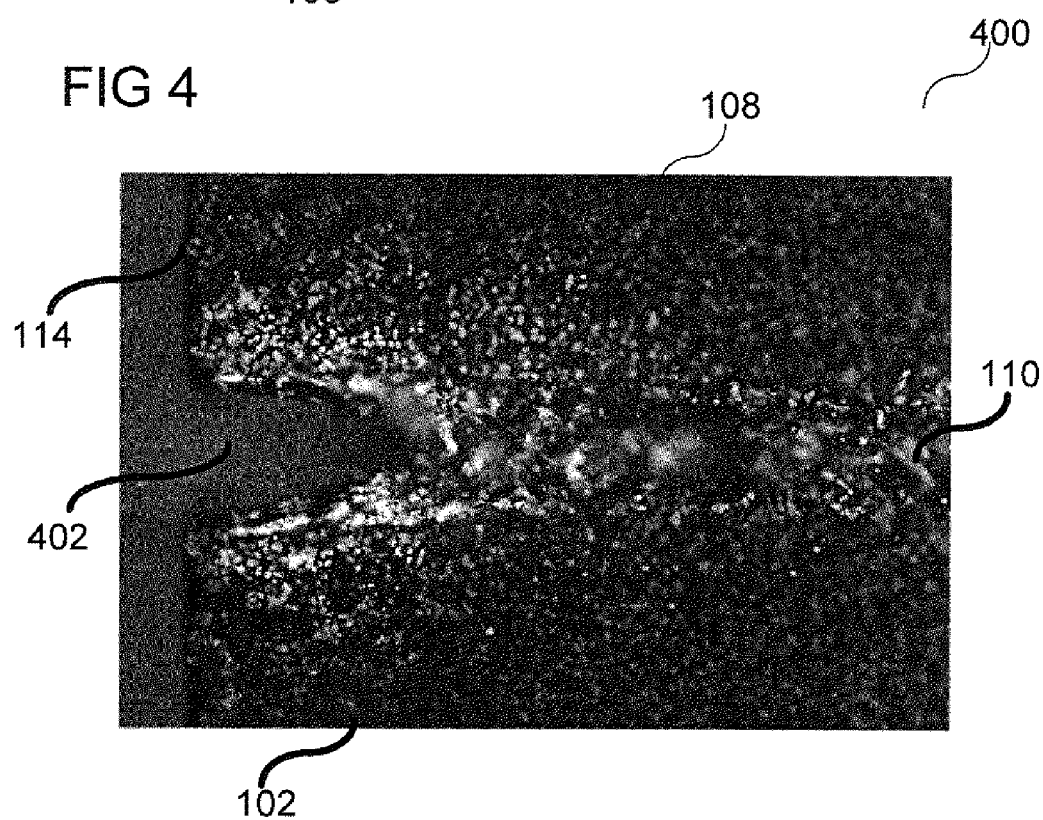
FIG. 4 shows a picture of a scratched wafer, in which it corresponds to a complete cut at the wafer end.

In the following detailed description, the reference will be made to the accompanying drawings, which form a part of this and in which specific embodiments are shown as an illustration, in which the disclosure can be exercised. In this respect, the directional terminology, such as "above", "below", "front", "behind", "forward", "rearward", etc. are used with reference to the orientation of the figure(s) described. Since, the components of embodiments can be positioned in a number of different orientations, the directional terminology serves as an illustration, and serves in no way as a limitation. It must be understood that other embodiments can be used and structural or logical modifications can be made, without departing from the scope of protection of the present disclosure. It must be understood that the features of the different exemplary embodiments described herein can be combined with each other, unless not specifically stated otherwise. Therefore, the following detailed description is not to be understood in a limiting sense, and the scope of protection of the present disclosure is defined by the attached claims.

Within the scope of this description, the terms "connected", "attached" and "coupled" are used for a direct as well as an indirect connection, a direct or indirect attachment and a direct or indirect coupling. Identical or similar units are provided with identical reference numerals in the figures, insofar as this is appropriate.

Figure 5:
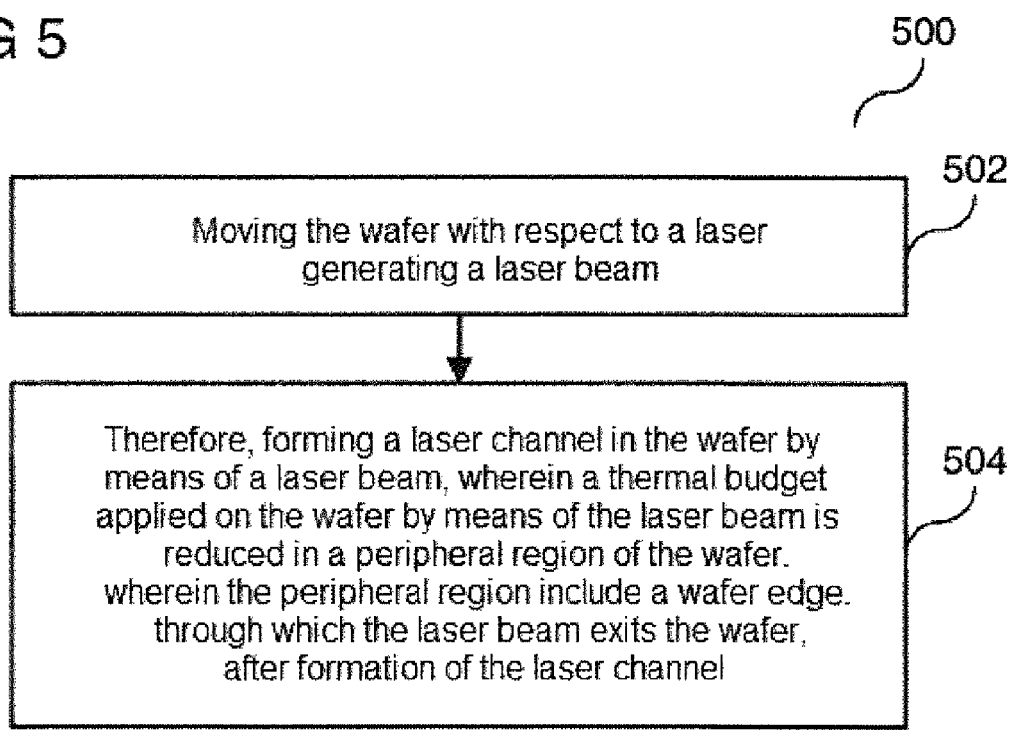
FIG. 5 shows a flow diagram, in which a method for processing at least one crystalline silicon wafer or a solar cell wafer according to different exemplary embodiments is represented.

FIG. 5 shows a flow diagram 500, in which a method for processing at least one crystalline silicon wafer or a solar cell wafer according to different exemplary embodiments is shown. The method can have in step 502, a movement of the wafer with respect to a laser generating a laser beam, and therefore in step 504, the formation of a laser channel in the wafer by means of a laser beam, wherein a thermal budget applied on the wafer by means of the laser beam is reduced in a peripheral region of the wafer, wherein the peripheral region has a wafer edge, through which the laser beam exits the wafer, after formation of the laser channel.

Even if the following exemplary embodiments frequently describe a solar cell wafer, the exemplary embodiments are correspondingly applicable to a crystalline silicon wafer.

A solar cell wafer can have at least one photovoltaic sheet (for instance as a part of a layer structure with one or more layers). The at least one photovoltaic sheet can have or consist of a semiconductor material (such as Silicon), a composite semiconductor material (for instance a III-V composite semiconductor material such as GaAs), a II-VI composite semiconductor material (such as CdTe), or a I-III-V composite semiconductor material such as $CuInS_2$). In different exemplary embodiments, the at least one photovoltaic sheet can have or consist of an organic material. In different exemplary embodiments, the Silicon can have or consist of a monocrystalline Silicon, polycrystalline Silicon, amorphous Silicon, and/or microcrystalline Silicon. The at least one photovoltaic sheet can have or consist of a junction structure, such as a pn-junction structure, a pin-junction structure, a Schottky-type junction structure and the like.

In different exemplary embodiments, the term Solar cell means a device, which converts the light energy (for instance at least a part of the light in the range of visible wavelength of approximately 300 nm to approximately 1150 nm, for instance sunlight) directly into electrical energy by means of the so-called photovoltaic effect.

Different exemplary embodiments relate to crystalline semiconductor wafer as solar cell wafer, for instance made of Silicon.

In different exemplary embodiments, the basic doping in the solar cell wafer can have a dopant concentration (for instance doping of a first type of conductor) in the range of approximately $10^{13}$ $cm^{-3}$ to $10^{18}$ $cm^{-3}$, for instance in the range of approximately $10^{14}$ $cm^{-3}$ to $10^{17}$ $cm^{-3}$, for instance in the range of approximately $10^{15}$ $cm^{-3}$ to $10^{16}$ $cm^{-3}$.

The wafer, for instance the solar cell wafer can have, for instance a round shape, such as a circular or an elliptical shape or a polygonal shape, such as a square shape. In different exemplary embodiments, the solar cells of the solar module may however also have a non-square shape. In these cases, the solar cells of the solar module are formed, for instance by dividing (for instance cutting) and thus by dividing one or more (also referred in their shape as standard solar cell) solar cell(s) into several non-square or square solar cells.

In different exemplary embodiments, the wafer, for instance the solar cell wafer can have the following dimensions: the width in the range of approximately 10 cm to approximately 50 cm, the length in the range of approximately 10 cm to 50 cm, and the thickness in the range of approximately 100 μm to approximately 300 μm.

Further, the surface of the solar cell wafer with a second type of conductor can be highly doped as opposed to the first type of conductor; and simultaneously or subsequently other surface areas of the surface with the second type of conductor can optionally be doped low.

In different exemplary embodiments, the surface areas can be doped with an appropriate dopant, such as Phosphorous. In different exemplary embodiments, the second type of conductor can be a p-type conductor and the first type of conductor can be an n-type conductor. Alternatively in different exemplary embodiments, the second type of conductor can be an n-type conductor and the first type of conductor can be a p-type conductor.

In different exemplary embodiments, the surface areas of the surface of the solar cell wafer can be highly doped with dopant for doping with the second type of conductor having a surface dopant concentration in the range of approximately $10^{18}$ $cm^{-3}$ to approximately $10^{22}$ $cm^{-3}$, for instance having a surface dopant concentration in the range of approximately $10^{19}$ $cm^{-3}$ to approximately $10^{22}$ $cm^{-3}$, for instance having a surface dopant concentration in the range of approximately $10^{20}$ $cm^{-3}$ to approximately $2*10^{21}$ $cm^{-3}$. The sheet resistance in the highly doped areas with the second type of conductor is in the range of approximately 10 Ohm/sq to approximately 80 Ohm/sq, for instance in the range of approximately 20 Ohm/sq to approximately 60 Ohm/sq, for instance in the range of approximately 25 Ohm/sq to approximately 40 Ohm/sq.

Further in different exemplary embodiments, optionally the other surface areas of the surface having the second type of conductor can be doped low with dopant with the second type of conductor having a surface dopant concentration in the range of approximately $10^{18}$ $cm^{-3}$ to approximately $2*10^{21}$ $cm^{-3}$, for instance having a dopant concentration in the range of approximately $10^{19}$ $cm^{-3}$ to approximately $10^{21}$ $cm^{-3}$, for instance having a dopant concentration in the range of approximately $5*10^{19}$ $cm^{-3}$ to approximately $5*10^{20}$ $cm^{-3}$. The sheet resistance in the low-doped areas having second type of conductor is in the range of approximately 60 Ohm/sq to approximately 300 Ohm/sq, for instance in the range of approximately 80 Ohm/sq to approximately 200 Ohm/sq, for instance in the range of approximately 100 Ohm/sq to approximately 150 Ohm/sq. In this manner, a selective emitter is clearly formed at least on the surface of the solar cell wafer.

Subsequently, the so-called contact finger can optionally be formed of, for instance metal, such as Silver or Aluminum.

The solar cell wafer 102 completed in this manner can be divided according to the method described above and discussed below in more details.

FIG. 6 shows a device 600 for processing at least one crystalline Silicon wafer 102 or a solar cell wafer 102 according to different exemplary embodiments.

In different exemplary embodiments, the device 600 can have a laser 602, a device 604, 606 for moving one or more wafers 102 with respect to the laser 602, and a control device 608, as it will be explained in still more details in the following.

The laser 602 can be arranged for generating a laser beam 610. In one configuration, the laser 602 can be a static laser 602, in other words, the laser 602 which is mounted immovable in a predefined position, for instance on a frame. In different exemplary embodiments, the laser 602 remains in the predefined position and does not move. A relative movement between the one or other wafers 102 and the laser 602 can be made as a result of that the wafer/s 102 can be guided along, under or above the laser 602 by means of the device 604, 606 for moving one or more wafers 102, so that the laser beam 610 generated by the laser 602 forms a laser channel 110 at the desired position on the wafer surface 108, which is used as a predetermined breaking point for an optional subsequent breaking process. The laser 602 can be arranged for generating the laser beam with a laser-power in the range of approximately 10 Watt to approximately 30 Watt.

The device 604, 606 for moving one or more wafers 102 with respect to the laser 602 can have a transport device 604 for moving one or a plurality of wafers 102. The transport device 604 can have one or more conveyor belts for receiving one or more wafers 102. The receiving area/s can have, for instance end stops for stopping the wafer/s 102. In different exemplary embodiments, the at least one receiving area can be formed by a plate introduced on the conveyor belt, for instance provided with a recess in which a respective wafer is placed, for instance laid, and then guided along above or under the laser 602, so that the laser beam 610 meets at the respective desired wafer surfaces. Thus, for instance the device 604, 606 and the laser 602 can be disposed and aligned with respect to each other in such a manner that the laser beam 610 forms a predefined desired run of a laser channel on the respective wafer surface of the wafer/s 102. For instance, the device 604, 606 and the laser 602 can be disposed and aligned with respect to each other in such a manner that the laser beam 610 runs through the middle of the wafer 102, so that two equal semi-wafers are formed after dividing the wafer along the laser channel 110. However, if desired, the laser channel 110 can also run along other positions within the wafer surface.

Furthermore, the device 604, 606 can have a drive 606, for instance in the form of a motor, for instance an electric motor which can be coupled to the transport device 604 and can drive this. The drive 606 is, in turn, coupled to the control device 608 and a starting or a stopping or the like is controlled by this as regards the drive parameter, for instance nominal speed of the transport device 604 with respect to the laser 602.

The control device 608 can have one or more control devices, for instance one or more control chips, for instance one or more controller, for instance implemented in the form of one or more processors, for instance microprocessors, and can control on the one hand, the device 604, 606 (for instance drive 606), and on the other hand, the laser 602. In other word, the control device 608 is arranged to control the laser 602 and/or the device 604, 606 for moving the at least one wafer 102 in such a manner that at least one laser channel 110 is formed in the at least one wafer 102 by means of the laser beam 610, wherein the thermal budget 702 (see diagram 700 in FIG. 7) applied on the wafer 102 in a peripheral region by means of the laser beam 610, is reduced, wherein the peripheral region 702 has a wafer edge 114, through which the laser beam 610 exits the wafer 102 after formation of the laser channel 110.

The peripheral region 702 can be formed by a surface area of the wafer 102, which extends away from the wafer edge 114 in the wafer, maximum up to 5 cm, for instance maximum up to 3 cm, for instance maximum up to 2 cm, for instance maximum up to 1 cm, for instance maximum up to 0.5 cm, for instance maximum up to 0.2 cm, for instance maximum up to 0.1 cm.

In different configurations, the thermal budget can be changed in various manners, so that it is reduced in the peripheral region 702 of the wafer 102 as compared to the inner region of the wafer 102.

Thus, for instance the wafer 102 can be moved with respect to the laser 102 outside of the peripheral region 702 with a first speed, and the wafer 102 can be moved with respect to the laser in a peripheral region 702 with at least a second speed, which is higher than the first speed. In other words, the transport device 604, 606 can be accelerated as regards the guiding along the respective wafer 102 to the laser 602, when the laser beam 610 enters in the peripheral region 702 of the respective wafer 102 as compared to the speed of the transport device 604, 606, when the laser beam 610 is outside of the output side peripheral region 702 of the wafer 102. For instance, the transport device 604, 606 is driven in such a manner that it guides the respective wafer 102 to the laser 602 with a lower speed, when the laser beam 610 emerges and starts through an input side wafer edge 612 on the wafer surface of the wafer 102 to form the laser channel 110. This lower speed is maintained or only slightly changed, as long as the laser beam 610 has not yet entered in the peripheral region 702 of the wafer 102. With the entry of the laser beam 610 in the peripheral region 702 of the wafer 102, the speed of the transport device 604, 606 and thereby the speed of the wafer 102 with respect to the laser beam 610, is increased, whereby the total thermal budget introduced in the peripheral region 702 by means of the laser beam 610, is reduced.

After the laser beam 610 has exited the respective wafer 102 through the laser channel 114, the relative speed is again reduced, so that the laser beam 610 is again guided on the wafer surface of the subsequent wafer 102 with a lower speed. Alternatively or additionally, after the laser beam 610 has exited the respective wafer 102 through the wafer edge 114, the laser-power of the laser beam 610 is again increased to a higher value, so that the laser beam 610 is again guided on the wafer surface of the subsequent wafer 102 with an increased laser-power.

Alternatively or additionally, for reducing the introduced thermal budget, the wafer 102, for instance outside of the peripheral region 702, is applied with a laser beam 610 having a first laser-power (represented in FIG. 7 by means of a first area 706 of a laser-power characteristic curve 704); and the wafer 102 can be applied with a laser beam in the peripheral region 702, 610 with a second laser-power, which is lower than the first laser-power (represented in FIG. 7 by means of a second area 708 of the laser-power characteristic curve 704). The laser-power characteristic curve 704 is represented in the diagram 700, which shows a laser-power 710 plotted over a processing position of the wafer 102.

For instance, the control device 608 can be arranged to apply the wafer 102 outside of the peripheral region 702 with the laser beam 610 of a first laser-power, and to apply the wafer 102 in the peripheral region 702 with the laser beam 610 of a second laser-power, which is lower than the first laser-power. The second laser-power can be in the range of approximately 10% to approximately 80% below the first laser-power. Furthermore, the second laser-power can decrease constantly or in steps and can be in the range of approximately 10% to approximately 80% below the first laser-power on the wafer surface.

The laser channel 110 formed is used, for instance, as a predetermined breaking point of the wafer 102 in a subsequent breaking process.

Therefore, after the formation of the laser channel 110, the respective wafer 102 is bent in a bending- and breaking device not shown (generally a dividing device) so much that it is breaks along the laser channel 110, generally divided.

In different exemplary embodiments, a laser-scratching process is clearly provided, in which the laser 620 with fixed (immovable) optics and a wafer 102 are moved with respect to each other, wherein the laser-power is reduced in the region of the wafer edge 114, through which the laser beam 610 exits the wafer 102, so that the depth of the scratch essentially remains constant even in the region of the wafer edge 114.

In different exemplary embodiments, the laser-power is clearly reduced in the region of the wafer edge 114 (peripheral region 702).

Various exemplary embodiments are used in the following process sequence:

The wafer, for instance the solar cells are supplied, for instance in a continuous process, on a conveyor belt. The alignment of the knife, for instance of the solar cells takes place, for instance by defined laying of the solar cells on the conveyor belt or by a mechanical alignment of the solar cells (end stop provided on the conveyor belt).

The laser 602 can be fixed and is continuously powered, wherein the laser beam can be intercepted in the solar cells gaps, for instance by a sunshine trap or can be ineffective due to a lower depth of focus outside of the conveyor level.

Therefore, in different exemplary embodiments, the laser-power is varied over the wafer 102 in such a manner that the laser-power at the wafer end (in other words output side wafer edge of the wafer) is lower than in the middle of the wafer.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A method for processing at least one crystalline silicon-wafer or a solar-cell wafer, wherein the method comprises:
    moving the wafer with respect to a laser producing a laser beam; and therefore forming a laser channel in the wafer by means of the laser beam, wherein a thermal budget applied on the wafer by means of the laser beam is reduced in the peripheral region of the wafer, wherein the peripheral region includes a wafer edge, through which the laser beam exits the wafer after formation of the laser channel;
    wherein the wafer is moved with respect to the laser outside of the peripheral region with a first speed; and
    wherein the wafer is moved with respect to the laser in the peripheral region with at least a second speed which is higher than the first speed.

2. The method according to claim 1, further comprising: dividing the wafer along the laser channel formed.

3. The method according to claim 2, wherein the wafer is broken along the laser channel formed.

4. The method according to claim 1, wherein the peripheral region is formed by a surface area of the wafer, which extends from the wafer edge maximum up to 5 cm into the wafer.

5. The method according to claim 1,
    wherein the wafer is applied, outside of the peripheral region, with a first laser beam of a first laser-power; and
    wherein the wafer is applied, in the peripheral region, with a laser beam of a second laser-power which is lower than the first laser-power.

6. The method according to claim 1,
    wherein the wafer is applied, outside of the peripheral region, with a laser beam;
    the focusing of which is in the plane of the wafer, and
    wherein the wafer is applied, within the peripheral region, with a laser beam;
    the focusing of the laser beam is outside of the wafer plane.

7. A method for processing at least one crystalline silicon-wafer or a solar-cell wafer, wherein the method comprises:
    moving the wafer with respect to a laser producing a laser beam; and therefore forming a laser channel in the wafer by means of the laser beam, wherein a thermal budget applied on the wafer by means of the laser beam is reduced in the peripheral region of the wafer, wherein the peripheral region includes a wafer edge, through which the laser beam exits the wafer after formation of the laser channel;
    wherein the wafer is applied, outside of the peripheral region, with a first laser beam of a first laser-power; and
    wherein the wafer is applied, in the peripheral region, with a laser beam of a second laser-power which is lower than the first laser-power.

8. The method according to claim 7, further comprising: dividing the wafer along the laser channel formed.

9. The method according to claim 8, wherein the wafer is broken along the laser channel formed.

10. The method according to claim 7, wherein the peripheral region is formed by a surface area of the wafer, which extends from the wafer edge maximum up to 5 cm into the wafer.

11. The method according to claim 7, wherein the wafer is moved with respect to the laser outside of the peripheral region with a first speed; and
    wherein the wafer is moved with respect to the laser in the peripheral region with at least a second speed which is higher than the first speed.

12. The method according to claim 7, wherein the wafer is applied, outside of the peripheral region, with a laser beam; the focusing of which is in the plane of the wafer, and
    wherein the wafer is applied, within the peripheral region, with a laser beam;
    the focusing of the laser beam is outside of the wafer plane.

13. The method according to claim 7, wherein the second laser-power is in the range of approximately 10 percent to 80 percent below the first laser-power.

14. The method according to claim 7, further comprising:
    decreasing stepwise the second laser-power to a range of approximately 10 percent to 80 percent below the first laser-power at the wafer edge.

15. A method for processing at least one crystalline silicon-wafer or a solar-cell wafer, wherein the method comprises:
    moving the wafer with respect to a laser producing a laser beam; and therefore forming a laser channel in the wafer by means of the laser beam, wherein a thermal budget applied on the wafer by means of the laser beam is reduced in the peripheral region of the wafer, wherein the peripheral region includes a wafer edge, through which the laser beam exits the wafer after formation of the laser channel;
    wherein the wafer is applied, outside of the peripheral region, with a laser beam;
    the focusing of which is in the plane of the wafer, and
    wherein the wafer is applied, within the peripheral region, with a laser beam;
    the focusing of the laser beam is outside of the wafer plane.

16. The method according to claim 15, further comprising: dividing the wafer along the laser channel formed.

17. The method according to claim 16, wherein the wafer is broken along the laser channel formed.

18. The method according to claim 15, wherein the peripheral region is formed by a surface area of the wafer, which extends from the wafer edge maximum up to 5 cm into the wafer.

19. The method according to claim 15, wherein the wafer is moved with respect to the laser outside of the peripheral region with a first speed; and
    wherein the wafer is moved with respect to the laser in the peripheral region with at least a second speed which is higher than the first speed.

20. The method according to claim 15, wherein the wafer is applied, outside of the peripheral region, with a first laser beam of a first laser-power; and wherein the wafer is applied, in the peripheral region, with a laser beam of a second laser-power which is lower than the first laser-power.

* * * * *